(12) United States Patent
DeHoff et al.

(10) Patent No.: US 6,408,935 B1
(45) Date of Patent: Jun. 25, 2002

(54) HEAT SINK ASSEMBLY WITH OVER-MOLDED COOLING FINS

(75) Inventors: Robert E. DeHoff, Mt. Joy; Jason Allen Brehm, Seven Fields, both of PA (US); Kevin A. Grubb, Groton, CT (US)

(73) Assignee: Thermal Corp., Stanton, DE (US)

( * ) Notice: Subject to any disclaimer, the term of this patent is extended or adjusted under 35 U.S.C. 154(b) by 0 days.

(21) Appl. No.: 09/639,165

(22) Filed: Aug. 16, 2000

(51) Int. Cl.⁷ .................................................. H05K 7/20
(52) U.S. Cl. ............................. 165/80.3; 165/104.33; 361/697; 361/700
(58) Field of Search ......................... 165/80.3, 185, 165/104.33; 257/719, 722; 361/704, 710, 697, 700

(56) References Cited

U.S. PATENT DOCUMENTS

| | | | |
|---|---|---|---|
| 5,038,858 A | | 8/1991 | Jordan .......................... 165/185 |
| 5,494,098 A | | 2/1996 | Morosas ....................... 165/121 |
| 5,533,257 A | | 7/1996 | Romero .................... 29/890.03 |
| 5,653,280 A | * | 8/1997 | Porter ......................... 165/80.3 |
| 5,917,699 A | * | 6/1999 | Hung et al. ................. 361/697 |
| 6,026,888 A | * | 2/2000 | Moore ......................... 165/80.3 |
| 6,058,012 A | * | 5/2000 | Cooper et al. ............... 361/704 |
| 6,166,904 A | * | 12/2000 | Kitahara et al. ............. 361/697 |
| 6,227,286 B1 | * | 5/2001 | Katsui ......................... 165/80.3 |
| 6,257,314 B1 | * | 7/2001 | Kuo | |

FOREIGN PATENT DOCUMENTS

WO    WO99/26286    *  5/1999   ......... H01L/23/427

* cited by examiner

*Primary Examiner*—Allen Flanigan
(74) *Attorney, Agent, or Firm*—Duane Morris LLP

(57) ABSTRACT

A heat sink assembly having a base formed through an injection molding process utilizing high conductivity plastic in which both the heat pipe and the cooling fins are over-molded into the base to form an integral assembly. The heat pipe is of known construction that operates to transfer heat from a source to a remote location for dissipation. The cooling fins are preferably of the folded fin array configuration and are embedded into the top surface of the heat sink base. A cooling fan can be mounted to the assembly to draw air across the folded fin array for dissipation of the heat conducted efficiently from the heat pipe into the heat sink, including the folded fin array. The thermal resistance of the heat sink is improved as the interface resistance and the spreading resistance between the heat pipe and the cooling fins are substantially reduced.

10 Claims, 3 Drawing Sheets

HEAT SINK ASSEMBLY WITH OVER-MOLDED COOLING FINS

BACKGROUND OF THE INVENTION

This invention relates to cooling devices for dissipating heat from electronic components and, more particularly, to a heat sink assembly cooperable with a heat pipe to dissipate heat transferred from a remote location by the heat pipe.

Electronic components produce heat during operation which must be dissipated in an efficient and effective manner, particularly in configurations such as laptop computers. Where a large number of heat producing electronic components are operating in a closely confined space, the removal and ultimate dissipation of the generated heat is of great importance for the proper operation of the components. When space and distance are limiting factors, the efficiency at which the generated heat is dissipated is also of critical importance.

With cost and efficiency being highly important factors in the manufacture and operation of heat sinks for electronic components, heat sinks are typically made of aluminum and/or aluminum alloys, which can be easily extruded into specially shaped parts. One known manner in forming an aluminum heat sink with parallel plate cooling fins can be found in U.S. Pat. No. 5,038,858 in which the heat sink base is formed with a series of grooves into which the cooling fins are mounted with a mechanical latch to form a strong metal-to-metal bond to improve the thermal transfer between the base and the cooling fins.

Heat pipes are well known in the electronics industry as an efficient mechanism for transferring heat generated by an electronic component to a remote location for dissipation in an effective manner. More particularly, the heat is generally transferred to a heat sink formed with an array of parallel plate cooling fins across which air is moved to extract the collected heat from the cooling fin array. Most typically, the parallel plate cooling fins are formed as a folded fin array in which a single sheet of conductive material, such as aluminum, is folded in a repeated fashion to form a uniform array of parallel cooling fins.

The folded fin array is mounted on a conductive base by either soldering or brazing, as is noted in U.S. Pat. No. 5,494,098, or by epoxy, as is noted in U.S. Pat. No. 5,533,257, to fix the folded fin array to the base in a manner by which the base receives heat transferred from the electronic component by the heat pipe and, in turn, transfers the collected heat to the folded fin array. A fan moving air across the folded fin array extracts the heat and cools the base in order to receive additional heat from the heat pipe. Soldering and brazing provide a better transfer agent across which heat is transmitted from the base to the folded fin array than does epoxy. In fact, epoxy is presently only about half as efficient in transferring heat from the base to the cooling fins as solder. Solder, however, is more expensive to utilize as the application of solder is more labor intensive and subjects the heat pipe to a greater risk of damage than does the application of epoxy.

It is desirable to provide a process for the attachment of an array of parallel plate cooling fins, particularly a folded fin array, that is at least as efficient as solder while reducing the cost of manufacture and assembly to that of epoxy.

SUMMARY OF THE INVENTION

It is an object of this invention to provide a heat sink assembly for the remote cooling of a heat source.

It is another object of this invention to reduce the cost of a heat sink assembly that can be utilized with electronic components to dissipate heat generated thereby at a remote location.

It is an advantage of this invention that heat is more efficiently conducted from the base of the heat sink to the cooling fins.

It is still another object of this invention to form the base of the heat sink with moldable high conductivity plastic which can be over-molded about the parallel plate cooling fins.

It is a feature of this invention that the parallel plate cooling fins are formed as a folded fin array.

It is another advantage of this invention that the cooling fins can be oriented in alternative configurations to be aligned with a cooling fan operable to draw air across the cooling fins.

It is yet another object of this invention to reduce the interface resistance between the cooling fins and the base on which the cooling fins are mounted.

It is still another advantage of this invention that the interface resistance between the heat sink base and the cooling fins is improved over known means for attaching cooling fins to the heat sink base.

It is another feature of this invention that the over-molding of the cooling fins into the high conductivity plastic base increases the contact area therebetween and, thus, decrease the interface resistance.

It is still another feature of this invention that the unitary construction of the heat sink assembly facilitates assembly of the unit into the equipment in which the unit is to be used.

It is yet another advantage of this invention that the mechanism for attaching the heat sink assembly can be molded into the assembly to enhance the use thereof.

It is a further advantage of this invention that a metal heat spreader plate can be over-molded into the heat sink assembly to maintain a unitary construction.

It is still another object of this invention to provide a heat sink assembly for use with electronic components which is durable in construction, inexpensive of manufacture, care-free of maintenance, facile in assemblage, and simple and effective in use.

These and other objects, features and advantages are accomplished according to the instant invention by providing a heat sink assembly having a base formed through an injection molding process utilizing high conductivity plastic in which both the heat pipe and the cooling fins are over-molded into the base to form an integral assembly. The heat pipe is of known construction that operates to transfer heat from a source to a remote location for dissipation. The cooling fins are preferably of the folded fin array configuration and are embedded into the top surface of the heat sink base. A cooling fan can be mounted to the assembly to draw air across the folded fin array for dissipation of the heat conducted efficiently from the heat pipe into the heat sink, including the folded fin array. The thermal resistance of the heat sink is improved as the interface resistance and the spreading resistance between the heat pipe and the cooling fins are substantially reduced.

BRIEF DESCRIPTION OF THE DRAWINGS

The advantages of this invention will be apparent upon consideration of the following detailed disclosure of the invention, especially when taken in conjunction with the accompanying drawings wherein.

DETAILED DESCRIPTION OF THE PREFERRED EMBODIMENT

Figure 1:
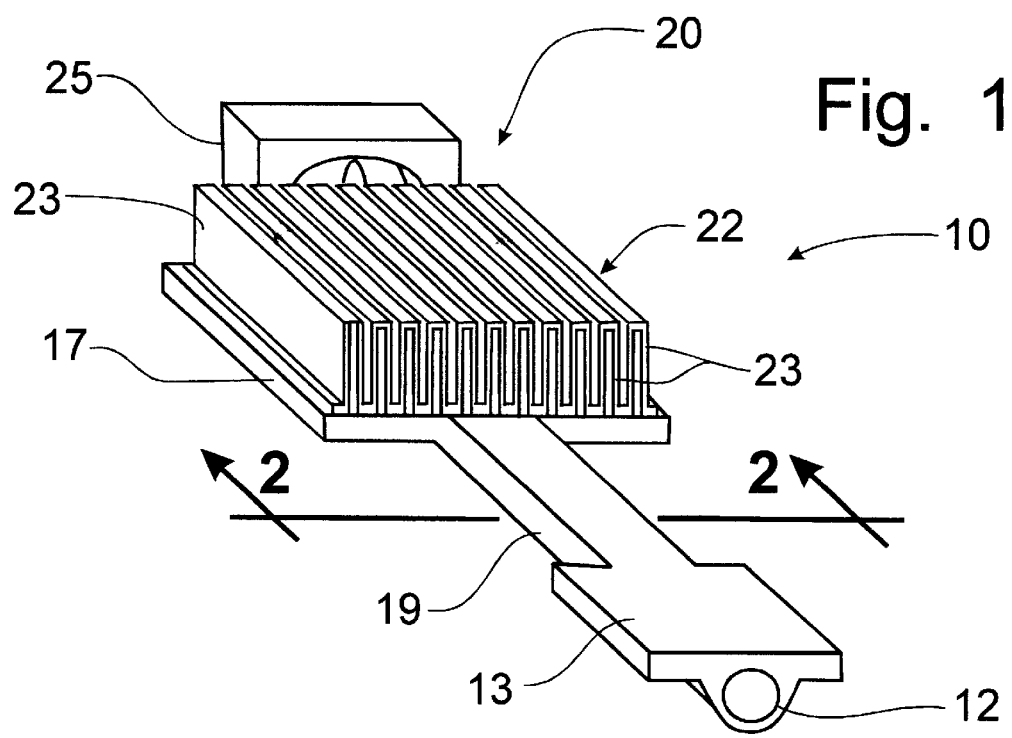
FIG. 1 is a perspective view of a heat sink assembly formed according to the principles of the instant invention to transfer heat generated at a point of origination to a remote location for dissipation.
Figure 2:
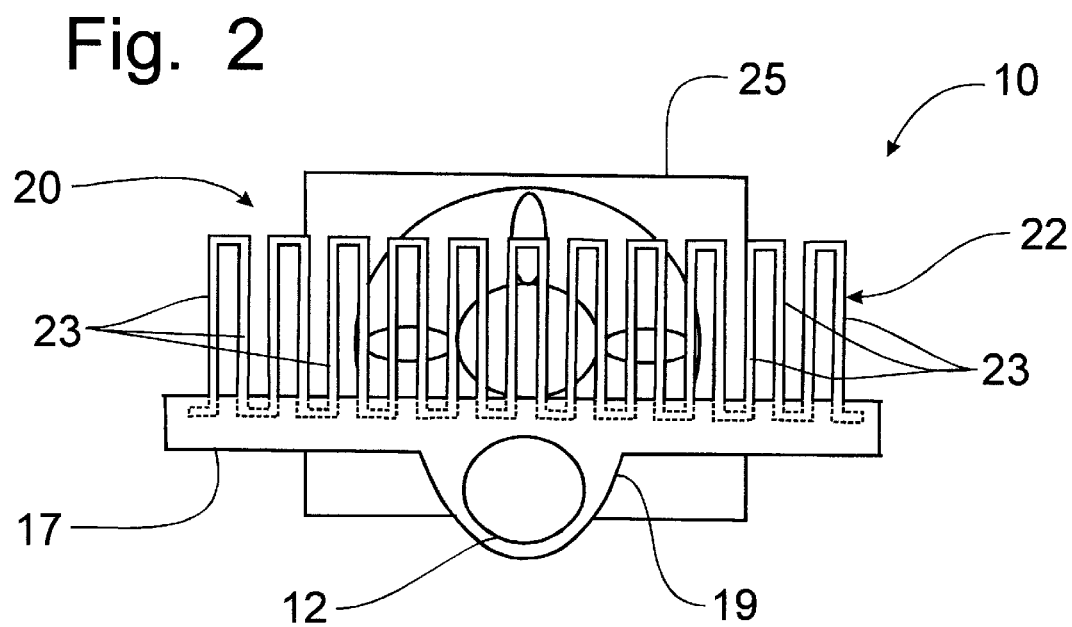
FIG. 2 is a cross-sectional view of the heat sink assembly shown in FIG. 1 taken along lines 2—2 to provide an elevational view of the assembly, the cooling fan being positioned behind the folded fin array to draw air through the parallel plates to dissipate heat therefrom.
Figure 3:
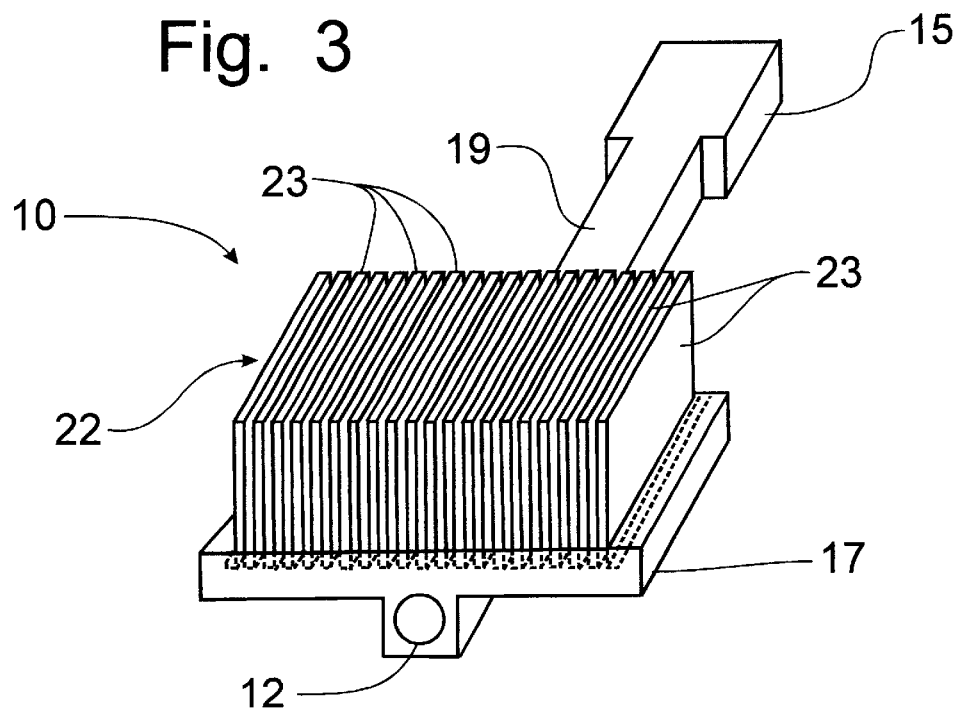
FIG. 3 is a perspective view of a slightly different heat sink configuration with the cooling fan being removed for purposes of clarity.

Referring now to FIGS. 1–4, a heat sink assembly incorporating the principles of the instant invention can best be seen. The heat sink assembly 10 is formed around a conventional heat pipe 12 of the type shown and described in U.S. Pat. No. 5,549,155. A heat input portion 15 is positioned adjacent to the point of origination of the heat generated, such as a printed circuit board in a portable computer, to absorb heat therefrom. The heat pipe 12 transfers the collected heat to a heat sink base 17 where the heat is transferred to a cooling apparatus 20 that dissipates the heat into the atmosphere by moving air across the cooling apparatus 20.

The cooling apparatus 20 is preferably formed as an array 22 of parallel plates 23 mounted in the heat sink base 17 and aligned with a cooling fan 25 which will either blow or draw air across the plates 22 to dissipate heat therefrom. Preferably, the parallel plates 23 are formed from a single sheet of material, such as aluminum, and folded into a convoluted array of fins 23. Excellent thermal transfer from the heat sink base 17 to the fins 23 is of critical importance to the efficiency of operation of the heat sink assembly 10. The transfer of heat is a function of the resistance and the area over which the heat can be conducted. Accordingly, the greater the area of contact the lower the resistance will be. Conventional methods of attaching the fins 23 to the heat sink base 17 include soldering or brazing and epoxy. While soldering and brazing provide an excellent capability of transferring heat to the fins 23 for dissipation, the process of soldering is labor intensive and requires skilled labor that results in significant expense. Epoxy provides a substantially less expensive process of attaching the fins 23 to the heat sink base 17 because skilled labor is not required; however, the thermal transfer properties of epoxy is significantly restrictive.

According to the principles of the instant invention, the folded fin array 22 is molded into the heat sink base 17 which is preferably formed from high conductivity plastic by an injection molding process. The folded fin array 22 can, therefore, be over-molded into the top of the heat sink base 17 to be formed as an integral part thereof. High conductivity plastic has thermal transfer properties close to that of aluminum and can be formed into any shape that can be created into a mold. Furthermore, the heat pipe 12 can also be over-molded into the heat sink base 17 and made an integral part thereof. The net result is that a highly conductive material is formed around the heat pipe 12 and the folded fin array 22 to provide an excellent transfer of heat to be dissipated by the cooling fan 25. Alternatively, the heat pipe 12 can be mechanically attached to the heat sink base 17 to provide greater flexibility in the manufacture and utilization of the heat sink assembly 10.

Figure 4:
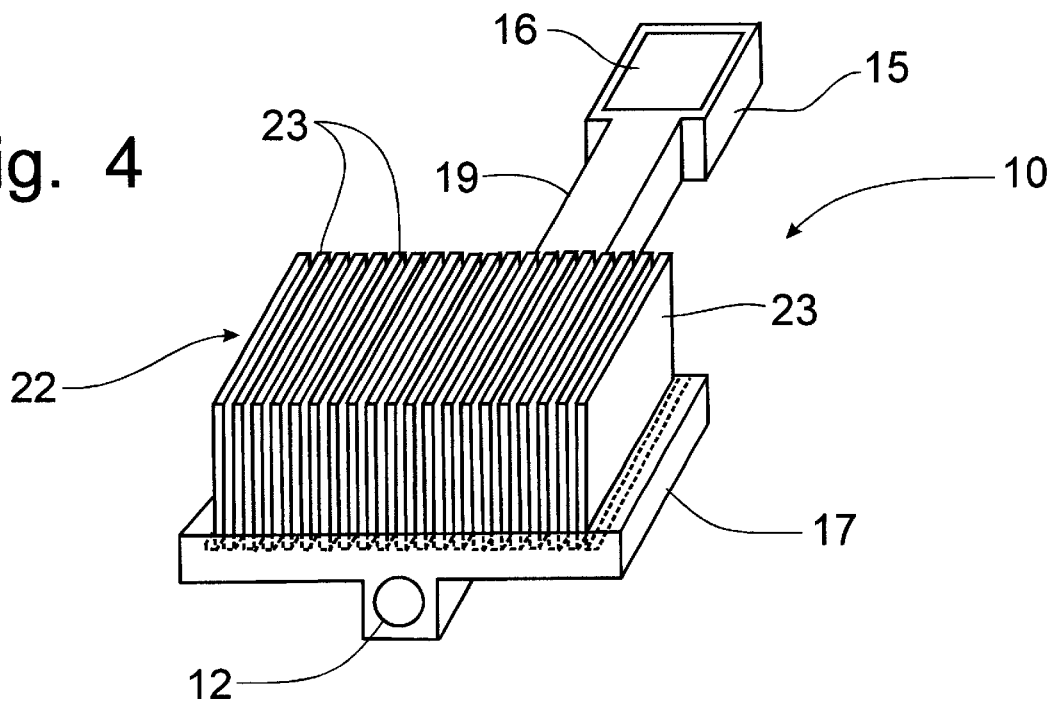
FIG. 4 is a perspective view of the heat sink depicted in FIG. 3 but incorporating a metal heat input plate to assist in transferring heat generated by the electronic component to the heat pipe for transfer to the fin array.

The transfer portion 19 extending between the heat input portion 15 and the heat sink base 17 allows the heat sink base 17 and the cooling apparatus 20 to be located at a position remote from the heat input portion 15. The length of the transfer portion 19 can be up to six to nine inches long, depending of the configuration required for the electronic device for which the heat sink assembly 10 is to be utilized. As depicted in FIG. 4, the heat input portion 15 can be provided with a metal heat input plate 16, which can also be over-molded into the heat input portion 15, to improve the transfer of heat generated by the electronic component (not shown) to the heat pipe 12 for transfer to the heat sink base 17.

Figure 5:
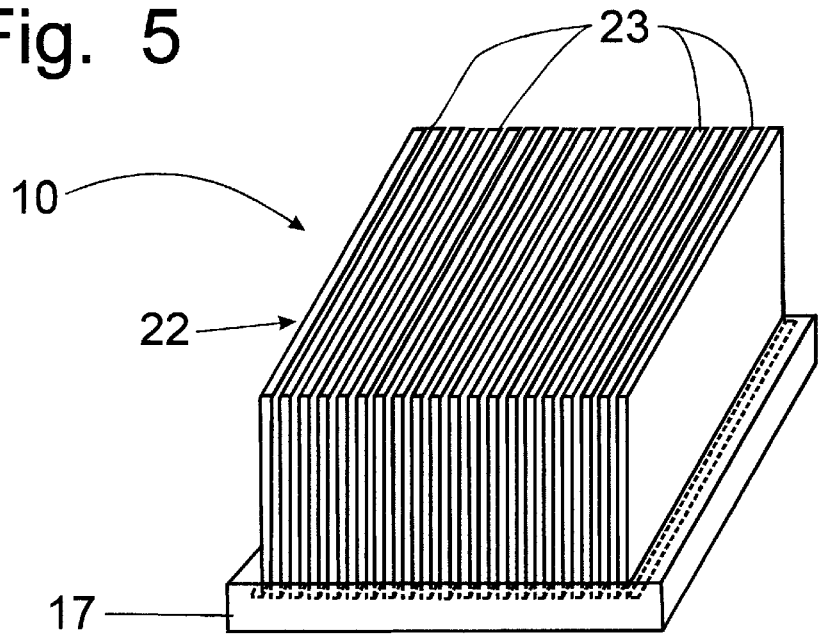
FIG. 5 is perspective view of another embodiment of the heat sink assembly incorporating the principles of the instant invention with the folded fin array being positioned immediately over the origination point.
Figure 6:
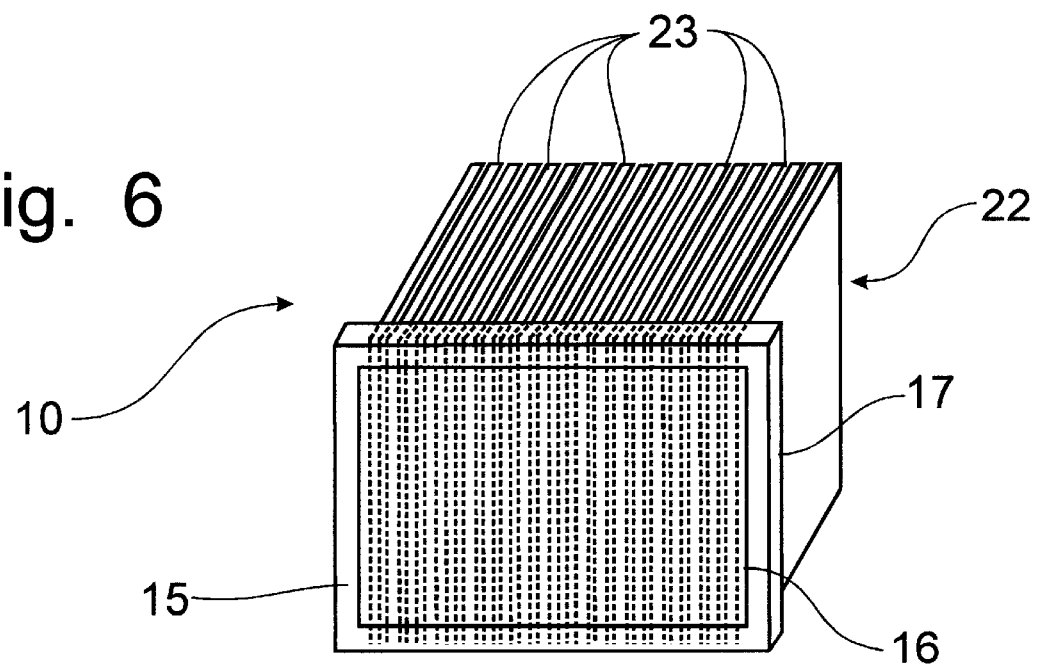
FIG. 6 is a bottom perspective view of the heat sink assembly depicted in FIG. 5 showing the metal heat input plate imbedded into the bottom of the heat sink base.

Referring now to FIGS. 5 and 6, an alternative embodiment of the instant invention can be seen. The folded fin array 22 is over-molded into the top of the heat sink base 17, which is thinner than the base 17 in the embodiments depicted in FIGS. 1–4 because the heat pipe 12 is not incorporated therein. In this embodiment of FIGS. 5–6, the heat sink base 17 is situated over the point of origination of the heat being generated and transfers the generated heat efficiently to the folded fin array 22 for dissipation by a cooling fan (not depicted for reasons of clarity). As shown in FIG. 6, the heat sink base 17 can be provided with a heat input plate 16, such as a Thermabase™ manufactured by Thermacore, Inc., to enhance the transfer of generated heat to the folded fin array 22.

With such an arrangement, the folded fin array 22 can be oriented in any direction to allow the cooling fan 25 to be mounted in a convenient location. For example, the fins 23 are shown in FIGS. 1–4 as being oriented parallel to the longitudinal axis of the transfer portion 19 of the heat sink assembly 10. Typically, known cooling fin configurations were formed with the fins or plates 23 extending transversely to the longitudinal axis of the transfer portion 19 so that the plates could be properly fixed to the base. With the instant invention, the parallel plates 23 can be oriented in either configuration, including the advantageous configuration shown in FIGS. 1–4. As new high conductivity plastics are developed, the instant invention will provide yet greater benefits to heat sink assemblies, providing improved cooling efficiencies to allow smaller heat sink assemblies to be utilized while providing equivalent abilities.

In each of the embodiments, the molded configuration of the heat sink assembly permits the incorporation of attachment features directly into the assembly. For example, mounting points can be molded into the heat input portion 15 to permit the assembly to be connected directly to a computer chip (not shown) to which the assembly 10 is to be associated. Furthermore, the cooling fan 25 can be mounted directly to the assembly 10 through the means of a connecting device (not shown) molded into the assembly 10. Alternatively, the cooling fan 25 can be over-molded into the heat sink assembly 10 to become a integral part thereof. The unitary construction of the assembly 10 permits the assembly 10 to be more easily mounted to or assembled into the parent equipment, such as a laptop computer.

It will be understood that changes in the details, materials, steps and arrangements of parts which have been described and illustrated to explain the nature of the invention will occur to and may be made by those skilled in the art upon a reading of this disclosure within the principles and scope of the invention. In the way of example, the fin array 22 need not be formed out of a single sheet of material to create the folded fin configuration. Individual parallel, of substantially parallel plates could be placed into the top of the injection mold to permit an over-molding of the plates to make them integral with the top of the heat sink base 17.

The foregoing description illustrates the preferred embodiment of the invention; however, concepts, as based upon the description, may be employed in other embodiment without departing from the scope of the invention. Accordingly, the following claims are intended to protect the invention broadly as well as in the specific form shown.

Having thus described the invention, what is claimed is:

1. A heat sink assembly for use in transferring and dissipating heat generated by electronic components comprising:
    a base member formed with a plastic material having a high conductivity factor and an ability to flow into an injection mold;
    a fin array formed from a single sheet of material and folded into a convoluted shape that incorporates a series of parallel plates through which air can be drawn to dissipate the heat generated from the electronic components, said fin array being over-molded into a top portion of said base member so that said fin array is converted into an integral part of said base member;
    a heat input portion positionable adjacent to said electronic components and formed on a bottom portion of said base member opposite of said fin array;
    a heat pipe over-molded into said base member and operably associated with said heat input portion to transfer heat generated by said electronic component to said base member; and
    a cooling fan mounted to move air across said fin array wherein said base member transfers heat from said heat pipe to said fin array and wherein said fin array is aligned so that air is moved between said parallel plates in a direction generally parallel to a line extending between said heat input portion and said base member.

2. The heat sink assembly of claim 1 wherein said heat input portion is spaced from said base member and is interconnected therewith by a transfer portion within which lies said heat pipe operable to transfer generated heat from said heat input portion to said base member.

3. The heat sink assembly of claim 2 wherein said heat input portion is provided with a metal heat input plate.

4. The heat sink assembly of claim 3 wherein said metal heat input plate is over-molded into said heat input portion.

5. The heat sink assembly of claim 1 wherein said heat input portion is spaced from said base member and is interconnected therewith by a transfer portion within which lies a heat pipe operable to transfer heat generated by said electronic components from said heat input portion to said base member.

6. The heat sink assembly of claim 5 wherein said heat pipe is also over-molded into said base member.

7. The heat sink assembly of claim 6 wherein said fin array is aligned so that air is moved between said parallel plates in a direction generally parallel to a line extending between said heat input portion and said base member.

8. The heat sink assembly of claim 7 further comprising a cooling fan is over-molded into said assembly to move air through said folded fin array, said cooling fan being an integral part of said assembly.

9. The heat sink assembly of claim 8 wherein heat input portion is provided with a metal heat input plate to facilitate the transfer of heat generated by said electronic components into said heat pipe.

10. The heat sink assembly of claim 9 wherein said fin array is located at a first elevation, said metal heat input plate being located at a second elevation different than said first elevation.

* * * * *